United States Patent [19] [11] 3,731,158
MacVicar et al. [45] May 1, 1973

[54] ELECTRODE-CARBON-ELECTRODE JUNCTIONS

[75] Inventors: Margaret L. A. MacVicar, Fenton, Mich.; Stuart M. Freake, Berkeley, Calif.; Clement J. Adkins, Cambridge, England

[73] Assignee: Massachusetts Institute of Technology, Cambridge, Mass.

[22] Filed: July 20, 1970

[21] Appl. No.: 56,425

[52] U.S. Cl. .....317/234 R, 317/234 T, 317/235 AT, 317/231, 317/234 S, 331/107 S, 307/306
[51] Int. Cl. ..........H01l 5/06
[58] Field of Search ..........317/234 T, 235 AT, 317/231, 234 S; 331/107 S; 307/306; 252/502 T; 29/599; 338/32 S, 25

[56] References Cited

UNITED STATES PATENTS

| | | | |
|---|---|---|---|
| 3,175,177 | 3/1965 | Gaugler | 338/28 |
| 3,420,756 | 1/1969 | Terajima | 204/38 |
| 3,423,607 | 1/1969 | Kunzler | 307/306 |
| 3,600,644 | 8/1971 | Eck | 317/234 |

OTHER PUBLICATIONS

Laibowitz, Appl. Phys. Let., Vol. 13, No. 7, Oct. 1968.

*Primary Examiner*—Martin H. Edlow
*Attorney*—Thomas Cooch, Martin M. Santa and Arthur A. Smith, Jr.

[57] ABSTRACT

Quantum mechanical tunneling barriers, and non-linear gates are comprised of disordered carbon and integrated as the middle layer in electrode-carbon-electrode junctions.

10 Claims, 6 Drawing Figures

Figure 1:
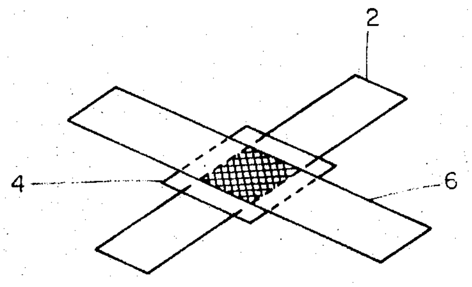

INVENTORS:
MARGARET L. A. MacVICAR
STUART M. FREAKE
CLEMENT J. ADKINS

INVENTORS:
MARGARET L.A. MacVICAR
STUART M. FREAKE
CLEMENT J. ADKINS

INVENTORS:
MARGARET L. A. MacVICAR
STUART M. FREAKE
CLEMENT J. ADKINS

ELECTRODE-CARBON-ELECTRODE JUNCTIONS

FIELD OF THE INVENTION

This invention relates generally to quantum mechanical, non-linear, and Josephson effect junction devices.

PRIOR ART

Tunneling junctions are comprised of two conductors which act as electrodes and a non-linear barrier sandwiched between the electrodes. A typical illustration is the thin film superconducting tunneling diode. It is comprised of two thin films made out of superconducting metals and an oxide tunneling barrier sandwiched between the two films in a manner analogous to Esaki-type diodes.

A similar type of junction is the solder-drop junction. It comprises a thin oxidized superconducting wire on which a drop of solder is cooled. Solder is a tin-lead alloy and a superconductor. Copper wires are embedded in the drop and these together with the ends of the oxidized wire form a four-terminal device of great electronic sensitivity.

Another example of a junction device is the Josephson or point-contact device. It is comprised of a superconducting base, an oxide layer on the base, and a superconducting wire sharpened to a fine point which is adjusted to be in mechanical contact with the plane surface of the superconducting base. Alternatively, the wire may have an oxide layer instead of the base.

In all these devices, the thickness and uniformity of the oxide layer is critical in determining the transport effects. The process of oxidizing is temperamental and difficult to control with respect to barrier thickness and uniformity. For example, a thin film function is conventionally made by heating a metal, such as aluminum, in a vacuum, and depositing it through a mask to form a thin film (approximately 4,000 angstroms) on a suitable substrate. The film is then exposed to air or oxygen for a short time after which another thin metal film (not necessarily of the same metal) is deposited. Some improvement can be achieved by using different oxidizing techniques such as exposing the film to a glow discharge, or by utilizing anodizing techniques but it is still very difficult to form the desired oxide barrier, particularly on metals like Au, Ag, Cu and Rhenium.

An alternative approach is to utilize a semiconductor as a barrier. The barrier height of a semiconductor is smaller than in an insulator like an oxide layer. Therefore, incident electrons penetrate further. Hence, for a given tunneling resistance, a thicker barrier can be used, offering greater fabrication control and reliability since thicker barriers are easier to make continuously and uniformly. For example, a 300 angstrom semiconductor barrier made out of CdS would have approximately the same tunneling resistance as a 30 angstrom oxide barrier.

In Sb, GAs, PbS, Te, Ge are examples of semiconductors which can be evaporated easily and used for barriers. One difficulty in using these semiconductors is the presence of tiny pinholes in thin layers which act as shorts between the electrodes. Some improvement is achieved by exposing the specimen to oxygen or the atmosphere to oxidize any part of the electrode exposed by the pinholes before evaporating the second electrode. This method is limited to devices in which the first electrode is made out of an oxidizable metal. Another drawback is the alloying effects between metals like Cu and Ag with many semiconductors. To avoid this latter difficulty, nonstoichometric compound semiconductors, like Ge and Te, which are relatively inert metallurgically, must be used.

SUMMARY OF INVENTION

In view of the aforementioned limitations with respect to oxide and semiconductor layers, it is applicants' primary object to create a new layer and new electrode-layer-electrode junction devices incorporating the new layer. These and other objects are met by a layer of disordered carbon and by electrode-carbon-electrode junction devices.

PREFERRED EMBODIMENT

Disordered carbon films are fabricated as non-linear layers and quantum mechanical barriers in junction devices. The term disordered is used in its common metallurgical sense and as so used allows some degree of ordering to be possible. A typical example is the thin film superconducting diode illustrated in FIG. 1. A first electrode 2 is made by heating a superconductor, like aluminum, in a resistive boat and evaporating it through a mask on a suitable substrate in a clean vacuum system at about $10^{-6}$ torr. A disordered carbon film 4 illustrated by the cross hatched section is then deposited in the same system. This can be accomplished by several methods. One technique is sublimation from a point-source contact between two carbon rods, the heating being produced by passing a large current through the rods. Another method is the bombarding of a carbon source with an electron beam. After the disordered carbon has been deposited, a second electrode 6, not necessarily of the same metal, is evaporated and deposited to complete the metal-carbon-metal junction.

The thickness of the electrode film and carbon barrier are monitored during deposition, e.g., by a quartz crystal microbalance. The thickness of the electrode film, which acts as an electrode and support for the carbon barrier is not critical. With respect to the thickness of the carbon layer it is difficult to put down an insulative layer less than approximately 50 angstroms as the carbon layer would be discontinuous. However, continuous and fairly uniform carbon layers may be deposited with an average thickness of about seventy angstroms. Useful carbon barriers with a minimum thickness of approximately 20–30 angstroms can be achieved by exposing the electrode and deposited barrier to oxygen or the atmosphere to oxidize any possible shorts; but this method is limited to those metal electrode films which are susceptible of oxidation.

If single crystals like rhenium or niobium which have very smooth surfaces are used as electrodes, thin carbon barriers approximately 20–30 angstroms can be deposited without shorts. Crystals like these are usually grown in ultrahigh vacuum by electron beam floating zone techniques and then the carbon is deposited without breaking the high vacuum.

The thickness of the carbon barrier will depend upon the operating characteristics desired. Thicker barriers have a higher resistance and smaller quantum probability of electron passage than thin barriers. Correspondingly, the slope of the voltage-current characteristic curve is greater for thicker barriers. On the other hand, an extremely thin barrier is desired to obtain Josephson effects.

Figure 5:
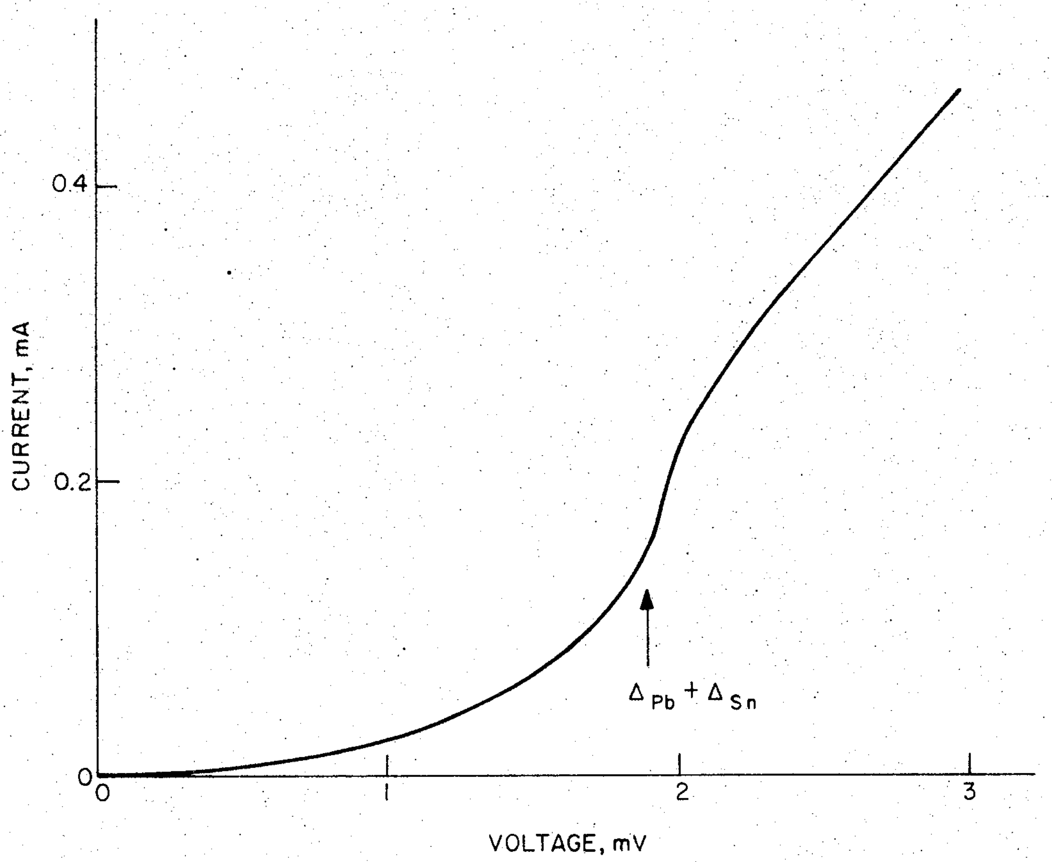

FIG. 5 illustrates the current-voltage characteristics of a Pb-C-Sn thin film junction at small voltage biases with a layer of carbon 140 angstroms thick at 1.25° Kelvin. The large change in slope which occurs at a voltage bias corresponding to $\Delta Pb + \Delta SN = 1.9$ meV is characteristic of tunneling between superconductors. (Here $\Delta Pb = 1.35$ meV and $\Delta SN = 0.55$ meV.) To the right of the change in slope, the current voltage characteristic is non-linear. This results from the onset of Schottky tunneling at higher applied voltages. In this region the junction acts as a non-linear gate.

Figure 6:
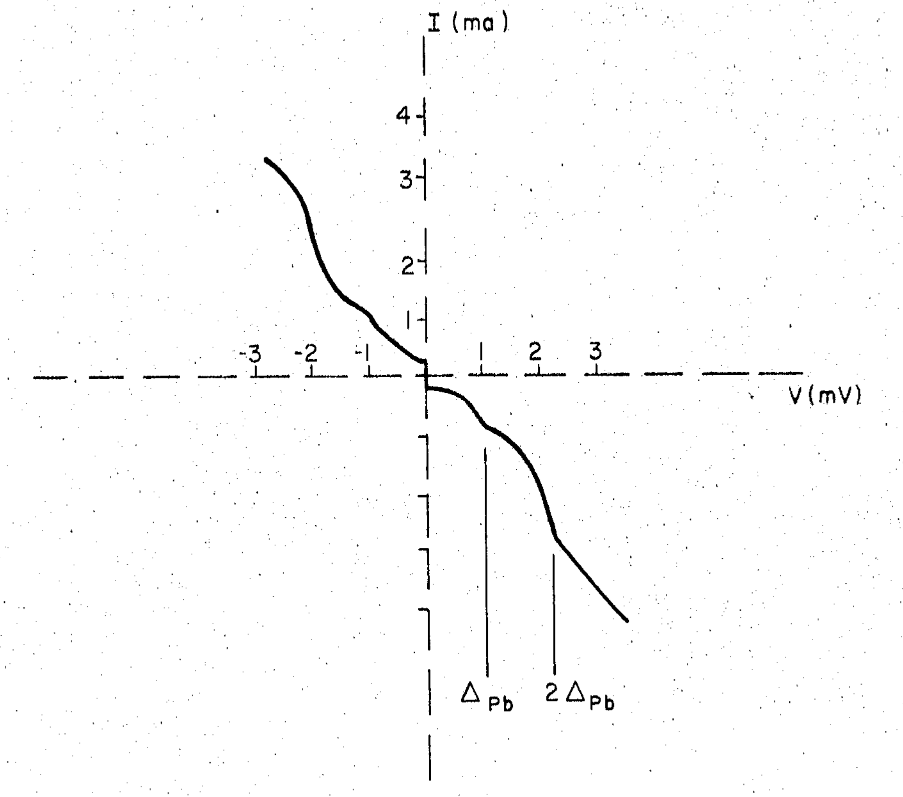

FIG. 6 illustrates the current-voltage characteristics of a Pb-C-Pb thin film junction with a layer of carbon 70 angstroms thick at 1.2° Kelvin. The Josephson effect is clearly seen at 0 volts bias.

Figure 2:
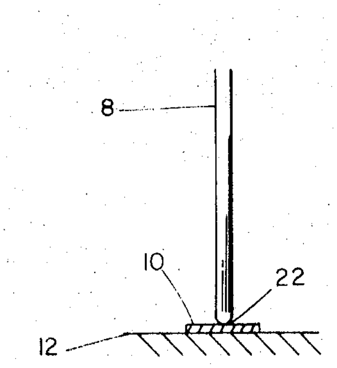
Figure 3:
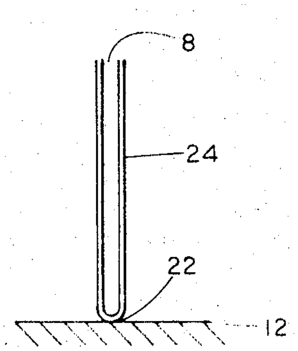

Another example of an electrode-carbon-electrode junction device is the point-contact junction illustrated in FIG. 2. A first electrode consists of a wire 8 with a pointed end 22. A second electrode is base 12 on which a carbon barrier 10 has been deposited. The wire electrode 8 is adjusted to contact with the carbon layer 10. An alternative arrangement is illustrated in FIG. 3. A disordered carbon barrier 24 is deposited on the wire electrode 8. The electrode 8 with the carbon barrier 24 makes contact at its pointed end 22 with the second electrode, base 12. The point contact device is widely used as a Josephson device to make accurate measurements on extremely small magnetic fields or voltages.

Figure 4:
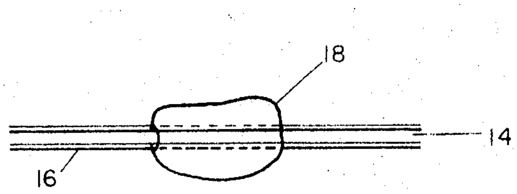

A third example of electrode-carbon-electrode junction device is the drop lead-tin alloy solder junction illustrated in FIG. 4. A first electrode comprised of wire 14 is coated with a thin layer of disordered carbon 16. A second electrode is formed by embedding the wire 14 and carbon layer 16 in a drop of solder 18 which is cooled.

These examples are not exclusive but only illustrative. There are many different forms and shapes, but in each instance a disordered carbon layer is placed between two electrodes to form a non-linear barrier in an electrode-carbon-electrode junction.

The carbon layer has several advantages over the oxide barriers as described in the prior art. For instance, it is metallurgically inert and does not present the stoichiometric problems inherent in the evaporated films of semiconducting compounds. Hence, the electrodes may be fabricated out of a wide variety of materials. For example, thin film junctions might consist of a metal-carbon-semiconductor or metal-carbon-insulator sandwich.

A second advantage of the carbon layer is the ease with which its thickness can be controlled in fabricating the barrier. A third advantage of the carbon layer is the absence of shorts between the electrodes and the uniformity of the barrier.

A fourth advantage of the carbon layer is its use in combination with semiconductors to form the middle layer in electrode-layer-electrode junction devices. Here, a thin semiconductor layer is deposited on the first electrode. This layer is coated with a very thin layer of disordered carbon to plug any pinholes in the semiconductor. The advantage of using the carbon is that it does not react with the semiconductor layer.

What is claimed is:

1. A superconducting quantum mechanical tunnel junction comprising:
   a. a first non-ferromagnetic superconductor electrode,
   b. a second non-ferromagnetic superconductor electrode
   c. a layer of disordered electrode, sandwiched between said electrodes.

2. A superconducting quantum mechanical tunnel junction as recited in claim 1 in which said layer of disordered carbon has a thickness of 10–1,000 angstroms.

3. A Josephson effect diode junction as recited in claim 1 with a layer of disordered carbon having a thickness of 10–100 angstroms.

4. A superconducting quantum mechanical tunneling drop junction comprising:
   a. a first non ferromagnetic electrode comprising a thin superconducting wire,
   b. a drop of lead-tin alloy solder,
   c. a layer of disordered carbon between said wire and formed drop of solder.

5. A superconducting quantum mechanical drop junction as recited in claim 4 in which said layer of carbon has a thickness of 10–1000 angstroms between said superconducting wire and drop of lead-tin alloy solder.

6. A Josephson effect junction comprising:
   a. a first non ferromagnetic electrode comprising a thin superconducting wire,
   b. a drop of lead-tin alloy solder,
   c. a layer of disordered carbon with a thickness between 10–100 angstroms between said wire and drop of solder.

7. A superconducting quantum mechanical tunneling point contact junction comprising:
   a. a first non ferromagnetic electrode comprising a superconducting wire with a fine pointed end,
   b. a second non ferromagnetic electrode comprising a superconducting metal base, and
   c. a layer of disordered carbon deposited on said base and to which said pointed end of said first electrode makes contact.

8. A superconducting quantum mechanical point contact junction as recited in claim 7 in which said layer of carbon is between 10–1,000 angstroms thick.

9. A Josephson effect point-contact device comprising said apparatus as recited in claim 7 with a layer of carbon 10–100 angstroms thick.

10. An electrode-layer-electrode junction device comprising:
   a. a first non ferromagnetic electrode,
   b. a second non ferromagnetic electrode,
   c. a layer of semiconductor with a coat of carbon between said first and second electrodes.

* * * * *